United States Patent
Nishii (10) Patent No.: US 7,059,044 B2
(45) Date of Patent: Jun. 13, 2006

(54) METHOD AND MATERIAL FOR MANUFACTURING CIRCUIT-FORMED SUBSTRATE

(75) Inventor: Toshihiro Nishii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 75 days.

(21) Appl. No.: 10/380,661

(22) PCT Filed: Jul. 17, 2002

(86) PCT No.: PCT/JP02/07262

§ 371 (c)(1),
(2), (4) Date: Oct. 6, 2003

(87) PCT Pub. No.: WO03/009660

PCT Pub. Date: Jan. 30, 2003

(65) Prior Publication Data

US 2004/0067348 A1    Apr. 8, 2004

(30) Foreign Application Priority Data

Jul. 18, 2001  (JP) .............................. 2001-217774

(51) Int. Cl.
*B32B 15/08* (2006.01)
*B05D 3/02* (2006.01)

(52) U.S. Cl. ............................ 29/835; 29/829; 29/830; 29/841; 427/208; 427/209; 427/372.2; 427/398.4

(58) Field of Classification Search ................ 428/209, 428/901; 174/250; 427/350, 444–445, 294, 427/208–209, 372.2, 398.4; 29/829–830, 29/835, 841
See application file for complete search history.

(56) References Cited

U.S. PATENT DOCUMENTS

| | | | | |
|---|---|---|---|---|
| 5,440,075 A | * | 8/1995 | Kawakita et al. | 174/265 |
| 5,478,972 A | * | 12/1995 | Mizutani et al. | 174/250 |
| 5,484,647 A | | 1/1996 | Nakatani et al. | |
| 5,538,789 A | * | 7/1996 | Capote et al. | 428/344 |
| 5,888,627 A | * | 3/1999 | Nakatani | 428/209 |

(Continued)

FOREIGN PATENT DOCUMENTS

JP    8-230106    9/1996

(Continued)

OTHER PUBLICATIONS

Kiyoshi Takagi, "Remarkable Development Trend of Buildup Multilayer PWB", Surface-Mount Technology, Nikkan Kogyo Shimbun, Ltd., Jan. 1997, pp. 2-11 (partial English translation).

*Primary Examiner*—Cathy F. Lam
(74) *Attorney, Agent, or Firm*—Wenderoth, Lind & Ponack, L.L.P.

(57) ABSTRACT

For the purpose of achieving enhanced reliability with respect to interlayer connections of printed wiring boards, a manufacturing method of printed wiring boards of the present invention includes any one of the steps of A) restricting the resin flowing in hot press processing, B) joining fiber reinforcements together by fusion or adhesion, C) having the thickness of a board material reduced after a filling process and D) forming a low fluidity layer via a filler mixed in a board material. Such properties as allowing the resin flowing in hot press processing to be controlled are provided to a material for manufacturing printed wiring boards of the present invention or to a volatile ingredient contained therein to allow the thickness of a board material to be reduced efficiently after a filling process.

7 Claims, 7 Drawing Sheets

U.S. PATENT DOCUMENTS 5,965,245 A * 10/1999 Okano et al. ............... 428/209
6,224,965 B1 * 5/2001 Haas et al. ................. 428/209

FOREIGN PATENT DOCUMENTS

| JP | 10-158472 | 6/1998 |
| JP | 10-256726 | 9/1998 |
| JP | 11-17295 | 1/1999 |
| JP | 11-68275 | 3/1999 |
| JP | 11-177199 | 7/1999 |
| JP | 2000-36666 | 2/2000 |
| JP | 2000-307246 | 11/2000 |
| JP | 2001-85838 | 3/2001 |

* cited by examiner

METHOD AND MATERIAL FOR MANUFACTURING CIRCUIT-FORMED SUBSTRATE

TECHNICAL FIELD

The present invention relates to methods and materials for manufacturing printed wiring boards used in diverse electronic apparatuses.

BACKGROUND ART

The recent trend towards smaller and higher-density electronic apparatuses is increasing the use of double-sided multi-layer boards compared with conventional one-side printed wiring boards on which electronic components are placed. Consequently, boards that can hold a higher density of circuits and components are being developed (e.g. "Marked development trend towards build-up multi-layer PWBs," Kiyoshi Takagi, January 1997, "Surface Mounting Technology," Nikkan Kogyo Shimbun).

Figure 6A:
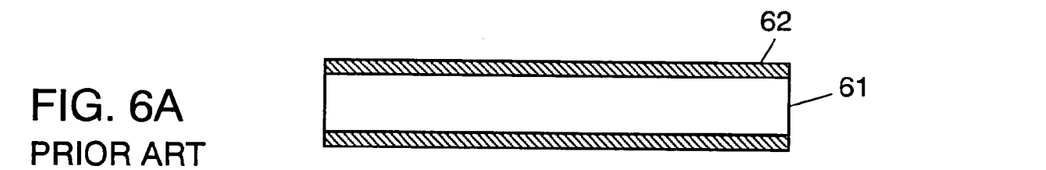
FIGS. 6A to 6G are sectional views illustrating each step of a conventional manufacturing method of printed wiring boards.

Prior art is described next with reference to FIGS. 6A to 6G. Board material 61 in FIG. 6A is a prepreg in B-Stage which is made by impregnating a thermosetting material such as epoxy resin into woven glass fabric for printed circuit boards, and then drying it. Film 62 is pasted on both faces of board material 61 by lamination, typically by hot rolling.

Figure 6B:
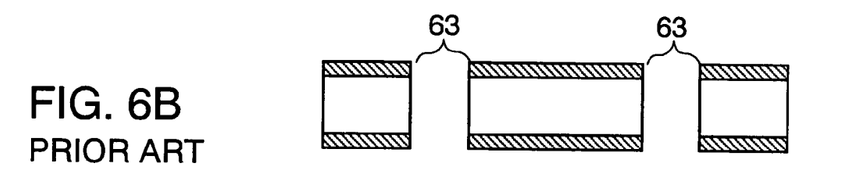
Figure 6C:
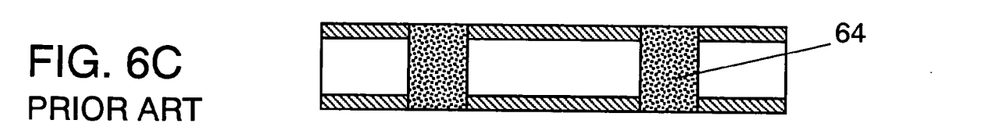
Figure 6D:
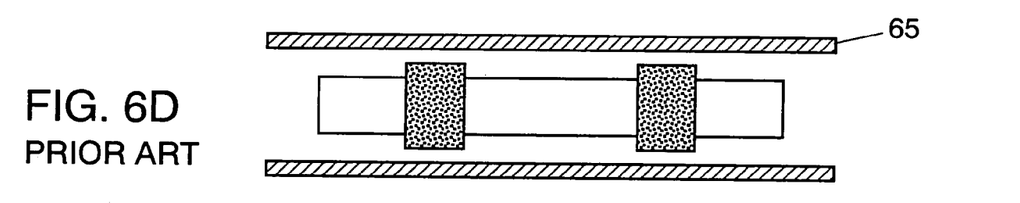

Next, as shown in FIG. 6B, via hole 63 is created in board material 61 using processing methods such as a laser beam. Then, as shown in FIG. 6C, conductive paste 64, made typically by mixing together conductive particles such as copper powder, thermosetting resin, curing agent, and solvent, is injected into via hole 63. Film 62 is then peeled off revealing conductive paste 64 protruding as shown in FIG. 6D. Copper foil 65 is disposed on both faces over this conductive paste 64, and heated and pressed using hot pressing equipment (not illustrated). This thermally cures board material 61 and compresses conductive paste 64 such that copper foils 65 on top and rear faces are electrically connected. Here, epoxy resin impregnated in board material 61 flows outward to form leaked portion 66. An unneeded portion at the edge is then cut to make a shape as shown in FIG. 6F, and then copper foil 65 is processed into a predetermined pattern, typically by etching, to create circuit 67. The double-sided printed wiring board as shown in FIG. 6G is thus completed.

In the above manufacturing method, however, electrical connection between the top and rear faces of the printed wiring board is unsatisfactory in some cases. In addition, a similar failure occurs, in some cases, between the surface layer and inner layer circuits when a multi-layer printed wiring board is formed using the above manufacturing method.

Figure 6E:
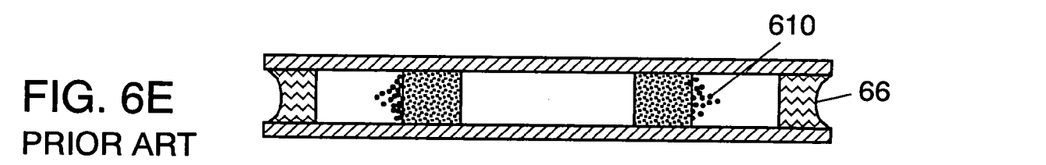
Figure 6F:
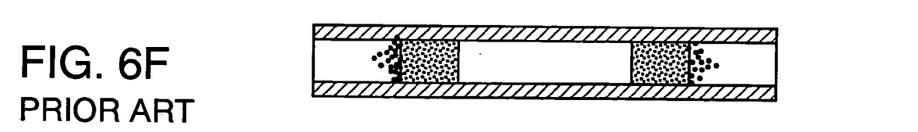
Figure 6G:
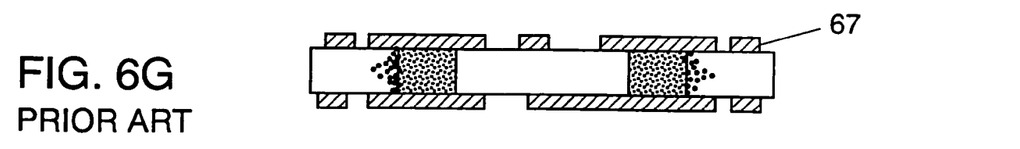

A major cause of this failure is leaking particle 610, originally a conductive particle in conductive paste 64, flowing out of via hole 63 as shown in FIG. 6E. To realize an ideal electrical connection, conductive paste 64 needs to be compressed vertically in FIG. 6E so that conductive particles in the conductive paste make firm and effective contact, and also firmly contact copper foil 65. However, as is apparent from the formation of leaked portion 66 during the steps shown in FIGS. 6D and 6E, the thermosetting resin in board material 61 flows outward. In this state, conductive particles in conductive paste 64 are pressed and flow horizontally as in FIG. 6E, resulting in conductive paste 64 being insufficiently compressed. Accordingly, the electrical connection through conductive paste 64 is unstable. The above description refers to a board material using woven glass fabric and thermosetting resin. The same phenomenon occurs with the use of inorganic fibers other than glass fiber, organic fibers such as aramid fiber, or nonwoven fabric other than woven fabric as reinforcement.

Figure 7A:
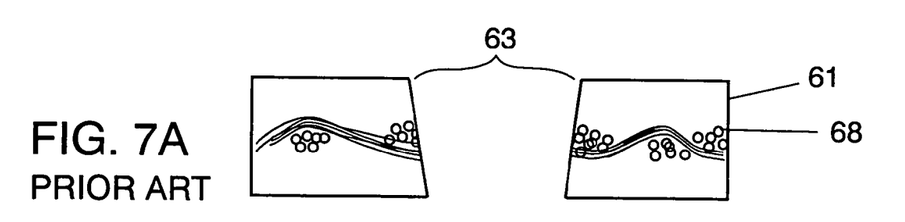
FIG. 7A is a sectional schematic view illustrating a via formation step in the conventional manufacturing method of printed wiring boards.
Figure 7B:
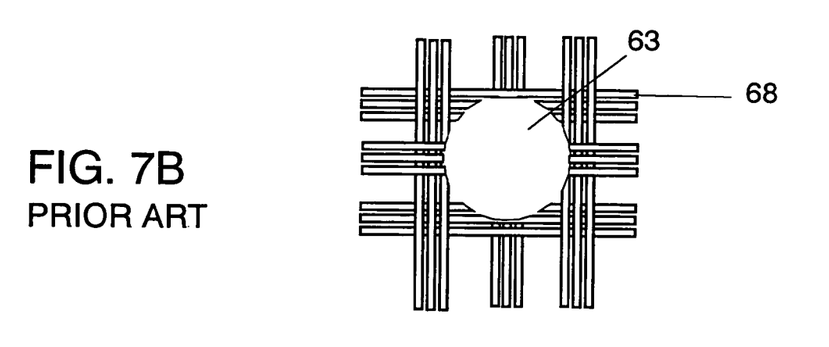
FIG. 7B is a top view of the via before filling conductive paste in the conventional manufacturing method of printed wiring boards.
Figure 7C:
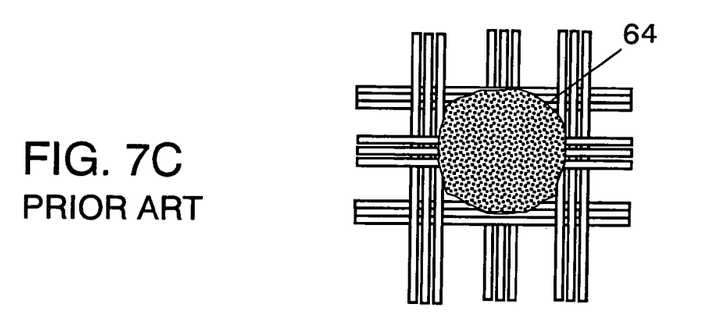
FIG. 7C is a top view of the via after filling conductive paste in the conventional manufacturing method of printed wiring boards.

If a woven fabric is used, the flow of thermosetting resin as described above is noticeable, since the flow resistance in woven fabric is particularly low. This makes it difficult to establish electrical connection using conductive paste. In addition, deviation of the fibers comprising woven fabric has a detrimental effect. This phenomenon is described next with reference to FIGS. 7A to 7C. As shown in FIG. 7A, via hole 63 is created by a laser beam on board material 61 containing woven glass fabric 68. Looking at this area from the top, via hole 63 is made by cutting woven glass fabric 68 as shown in FIG. 7B. The processes described using FIGS. 6C to 6E are then applied. As shown in FIG. 7C, when via hole 63 on the printed wiring board is observed after these processes, conductive paste 64 is seen to have spread around via hole 63 and woven glass fabric 68 is also moved outward from via hole 63, compared to the initial regular arrangement, due to the pressing force applied during hot pressing and the flow of impregnated resin. The occurrence of the above phenomenon impedes efficient compression of conductive paste 64. This phenomenon is thus a disadvantage, manifested as variations in electrical connection resistance and less reliability, in the manufacture of printed wiring boards.

Since thinner printed wiring boards are in increasing demand, thin woven glass fabrics are often used. Such material contains a lower density of glass fiber, which means relatively larger spaces are present between fibers, aggravating the above disadvantage. In particular, the above phenomenon becomes serious when woven glass fabrics less than 100 μm thick are used.

The major factors determining the compression rate of conductive paste 64 are the degree of compression in the thickness direction of board material 61 in the hot press processing in FIGS. 6D and 6E and the protruding distance of conductive paste 64 from board material 61 in FIG. 6D. Since there are numerous interlayer connecting points through via holes 63 on a high-density printed wiring board, another element for effecting compression of conductive paste 64 is required in addition to controlling the above two major factors.

SUMMARY OF THE INVENTION

A manufacturing method of printed wiring boards of the present invention restricts resin flow during hot press processing. This achieves efficient electrical connection by an interlayer connector such as conductive paste.

In a material for manufacturing printed wiring boards of the present invention, resin of controlled fluidity in hot press processing is used. This achieves efficient electrical connection by an interlayer connector such as conductive paste.

Consequently, the reliability of the interlayer electrical connection, typically using conductive paste, significantly increased. Thus, the present invention offers high-quality, high-density printed wiring boards.

DETAILED DESCRIPTION OF THE INVENTION

Exemplary embodiments of the present invention are described below with reference to drawings. Those with the same configurations are given the same reference marks for reasons of simplicity.

First Exemplary Embodiment

FIGS. 1A to 1G are sectional views illustrating each step of a manufacturing method and manufacturing material of printed wiring boards in a first exemplary embodiment of the present invention.

Figure 1A:
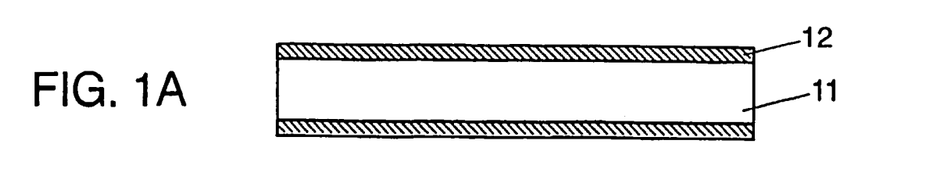
FIGS. 1A to 1G are sectional views illustrating each step of a manufacturing method of printed wiring boards in accordance with a first exemplary embodiment of the present invention.

As shown in FIG. 1A, film 12 with a thickness of 20 μm is pasted on both faces of board material 11. Board material 11 is made of a prepreg 100 μm thick using woven glass fabric as reinforcement, impregnated with thermosetting epoxy resin. Film 12 is made of polyethylene terephthalate (PET). Film 12 can be coated with thermosetting resin such as epoxy resin as required.

Figure 1B:
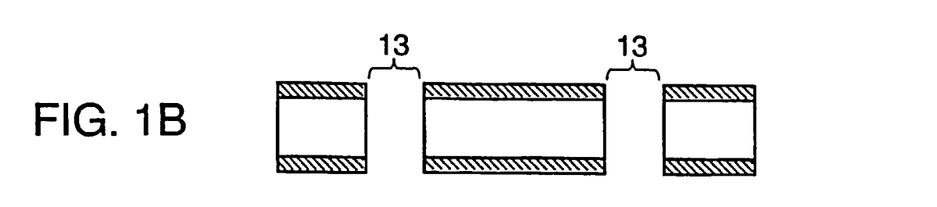

Then, as shown in FIG. 1B, via holes 13 with a diameter of about 200 μm are created using a $CO_2$ gas laser beam.

Figure 1C:
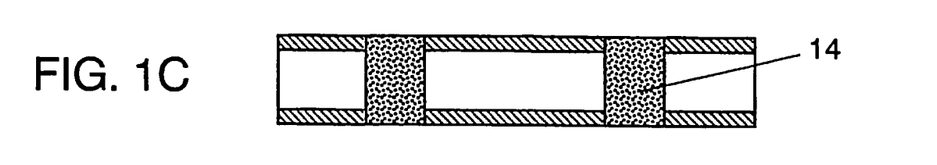

Then, as shown in FIG. 1C, conductive paste 14 is injected into via holes 13, typically by screen printing. Conductive paste 14 is made by mixing copper powder particles about 5 μm in diameter, thermosetting resin, and curing agent. Solvent can also be added to the conductive paste 14 to adjust its viscosity.

Figure 1D:
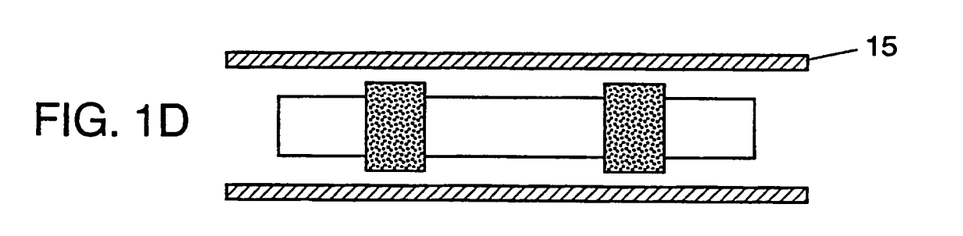

Next, as shown in FIG. 1D, conductive paste 14 protrudes from board material 11 for about the thickness of film 12 after film 12 on both faces of board material 11 is peeled off. Copper foil 15 is then placed on both of these faces.

Figure 1E:
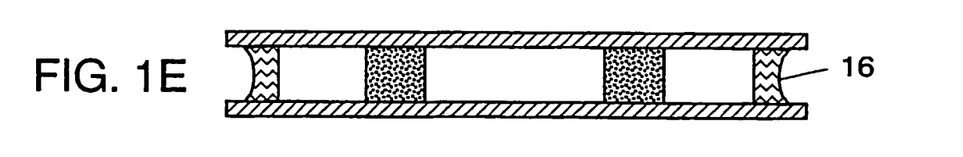

Next, hot press processing is applied to heat and press board material 11 vertically into the shape shown in FIG. 1E. In this process, thermosetting resin in board material 11 flows to create leaked portion 16.

Figure 1F:
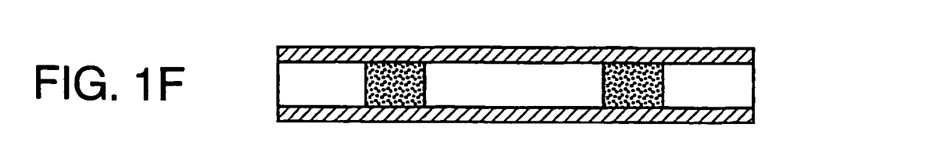
Figure 1G:
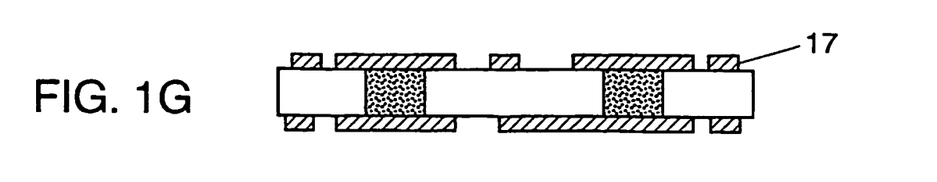

Next, as shown in FIG. 1F, a peripheral area of board material 11 is cut to a predetermined size. Copper foil 15 is etched to form a pattern of circuit 17 to complete a double-sided printed wiring board (C-stage) as shown in FIG. 1G.

In the above processes, a weight of resin which becomes fluid in the hot press process and flows out to the peripheral area of board material 11 in proportion to the weight of board material 11 before hot-pressing (i.e., the percentage of weight of leaked portion 16 in FIG. 1E) is called the resin flow rate. The resin flow rate needs to be 20% or less to solve the disadvantage of insufficient electrical connection by conductive paste 14, as described in the Background Art.

Table 1 shows some of the results of an experiment on the resin flow rate examined by the inventor.

Table 1 summarizes the following measurement results.

1) Thickness of the board material before and after the hot press process; 2) The resin flow rate calculated based on the weight of the leaked portion generated in the peripheral area in the hot press process and the weight of the board material before the hot press process; and 3) Via connection resistance (average) per point calculated based on the electrical resistance of a test pattern circuit in which 500 via holes create series circuits using the copper foil on the top and rear faces of the board.

Sample 1 has a resin flow rate of 22.8%, and via connection resistance varies between several ohms and several hundred ohms. Worse, vias without electrical connection are present. Observation of the section of the via in Sample 1 reveals that the conductive particles in conductive paste 14 have flowed out.

However, if the hot press conditions are adjusted to reduce the resin flow rate, as in Samples 2 to 7, the via connection resistance falls. By maintaining the resin flow rate at 20% or less, a practical via connection resistance is achievable. Moreover, samples show preferable characteristics in the reliability tests when the resin flow rate is 20% or less, including measurements of secular changes in via connection resistance after being shelved for a long period at high temperature and high humidity. Furthermore, as apparent from the results shown in Table 1, good initial via connection resistance is achieved when the resin flow rate is 10% or less. In this case, even better results are also obtained with respect to reliability.

A lower resin flow rate is effective for achieving better electrical connections. On the other hand, as shown by the results of Sample 7, a resin flow rate of 1% or more is needed for good moldability of board material 11 during hot pressing. The "filling defect" indicated in Table 1 refers to the following phenomenon. After the hot press process, a whitish area is visible on the board of Sample 7. When this portion is magnified, bubbles and a rough surface of the board material are observed. This happens when the resin flow is insufficient for smoothening the rough surface of an inner-layer circuit, causing bubbles and unevenness. This is a defect, called measling, that is known to occur during the manufacture of printed wiring boards. When this measling occurs, characteristics such as the strength against peeling the copper foil and solder heat resistance are adversely affected.

TABLE 1

| Sample No. | Board material thickness before hot pressing (μm) | Board material thickness after hot pressing (μm) | Resin flow rate (%) | Via connection resistance (mÙ) | Remarks |
|---|---|---|---|---|---|
| 1 | 130 | 85 | 22.8 | | Large variation |
| 2 | 130 | 90 | 20.3 | 18 | |
| 3 | 130 | 100 | 15.2 | 10 | |
| 4 | 130 | 110 | 10.1 | 5 | |
| 5 | 130 | 120 | 5.1 | 4 | |
| 6 | 130 | 125 | 2.5 | 4 | |
| 7 | 130 | 129 | 0.5 | 3 | Filling defect |

One effective means of achieving a resin flow rate of 20% or less, as mentioned above, is to control the rate of temperature rise to 3° C./min or slower during the hot pressing process. However, taking account of the possibility for an extremely long hot press process or the detrimental effect on resin moldability due to too slow of a temperature rise, the temperature rise speed is preferably set to 0.5° C./min or faster.

Also with consideration of the change in viscosity caused by increasing the temperature of resin contained in board material 11, the temperature rise speed can be limited to 3° C./min or less only during the period when the flow rate increases in the hot press process, and the temperature is increased at a higher speed at other times in the process.

Alternatively, the characteristics of board material 11 can be controlled to achieve the above effect. Uncured epoxy resin is heated and dried to control its volatile ingredient, residual solvent, and progress in thermosetting by heating temperature and time to allow adjustment of its curing time. Based on this method, the curing time, which represents the characteristic of fusion and curing of the board material during hot pressing, is set to 110 seconds or less. The use of the board material containing such resin material allows the resin flow rate to be limited to 20% or less, assuring good electrical connection between layers by conductive paste.

To avoid the occurrence of the aforementioned filling defect, the curing time is preferably set to 10 seconds or longer. Furthermore, with consideration of bondability between copper foil 15 and board material 11 in FIG. 1E or balancing of variations in the resin amount, the curing time is preferably set to 50 seconds or longer.

Second Exemplary Embodiment

The first exemplary embodiment refers to double-sided printed wiring boards. As shown in FIGS. 2A to 2E, the present invention is also applicable to the manufacture of multi-layer printed wiring boards.

Figure 2A:
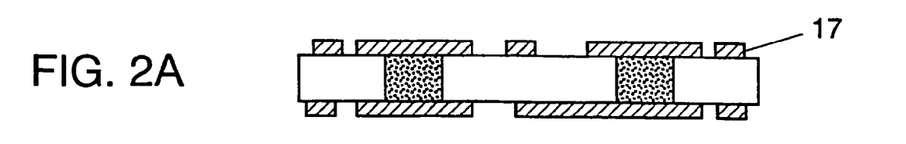
FIGS. 2A to 2E are sectional views illustrating each step of a manufacturing method of printed wiring boards in accordance with a second exemplary embodiment of the present invention.
Figure 2B:
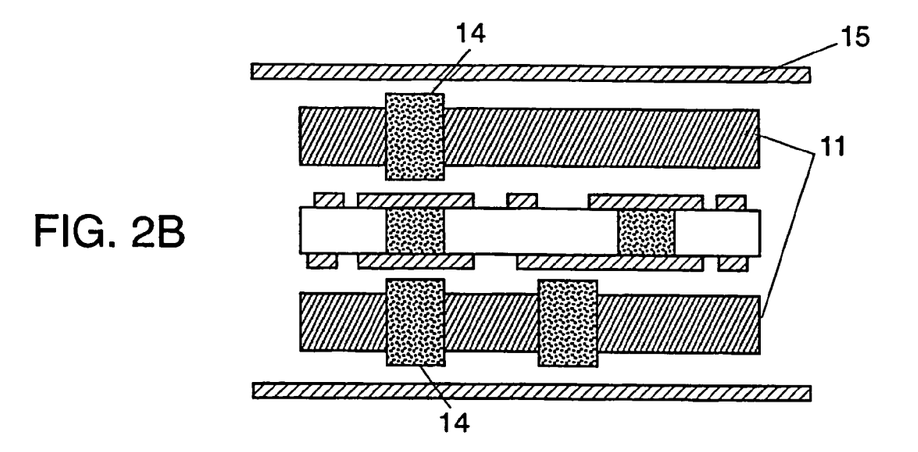
Figure 2C:
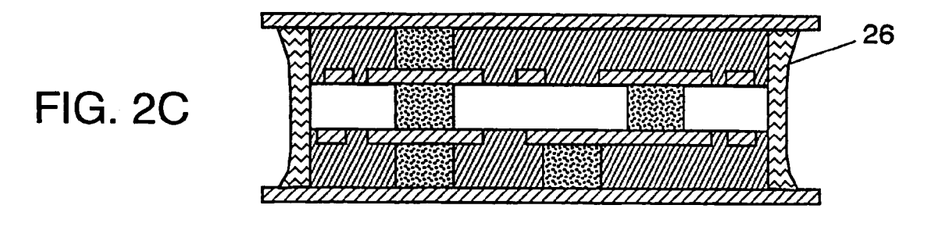

First, the double-sided printed wiring board (C-stage) as shown in FIG. 2A is prepared. Then, as shown in FIG. 2B, board material 11 filled with conductive paste 14 and copper foil 15 are positioned on the top and rear faces of the double-sided printed wiring board, and heat and pressure are applied, typically by hot pressing equipment. This results in molding and curing of board material 11, as shown in FIG. 2C. At this point, the ingredients of board material 11 flowing out forms leaked portion 26.

In the above processes, the weight of leaked portion 26 in proportion to the weight of two board materials 11 (resin flow rate) is set to 20% or less using the methods described in the first exemplary embodiment.

Figure 2D:
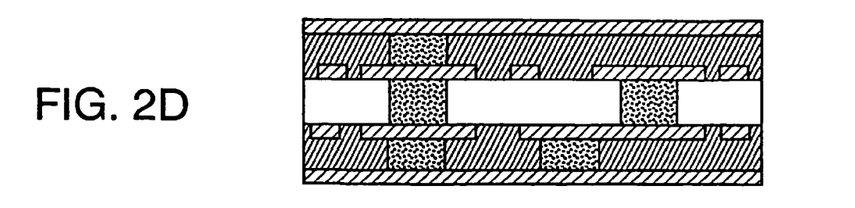
Figure 2E:
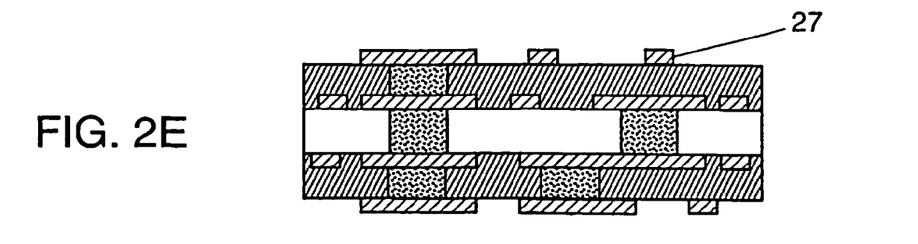

Next, after cutting off the unneeded peripheral area to achieve the shape shown in FIG. 2D, copper foil 15 is patterned, typically by etching, to create circuit 27, and to obtain a four-layer printed wiring board as shown in FIG. 2E. Also, in the manufacture of the above multi-layer printed circuit board, a good electrical connection between layers is established by applying the manufacturing method and material of printed wiring boards of the present invention.

To fill the rough surface of the circuit on the inner-layer printed wiring board, a resin flow rate of 1% or more is required in the manufacture of multi-layer printed wiring boards. In addition, if the resin flow rate is limited to 20% or less by controlling the curing time of the resin contained in board material 11, the curing time is preferably at least 50 seconds and at most 110 seconds, taking into consideration the need to fill the inner-layer circuits.

The double-sided printed wiring board used in the second exemplary embodiment can be either the one described in the first exemplary embodiment or a board in which layers are connected using commonly employed methods such as plating. In addition, a structure for temporarily press-bonding board material 11 onto the double-sided printed wiring board is applicable in the step shown in FIG. 2B.

Third Exemplary Embodiment

A third exemplary embodiment of the present invention is described next with reference to FIGS. 3A to 3C.

Figure 3A:
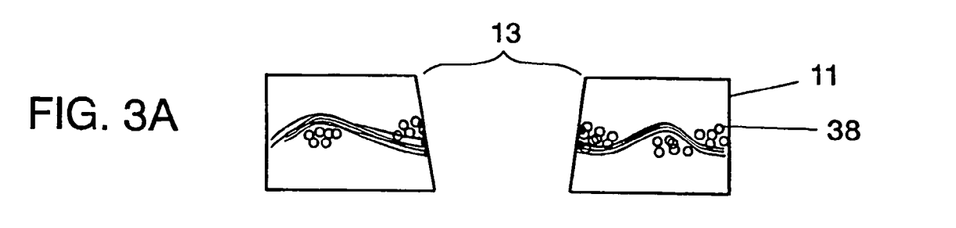
FIG. 3A is a sectional schematic view illustrating a via formation step in a manufacturing method of printed wiring boards in accordance with a third exemplary embodiment of the present invention.
Figure 3B:
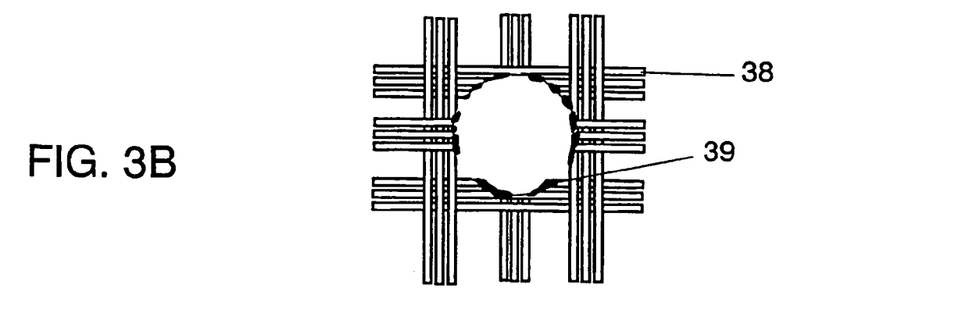
FIG. 3B is a top view of the via before filling conductive paste in the manufacturing method of printed wiring boards in accordance with the third exemplary embodiment of the present invention.
Figure 3C:
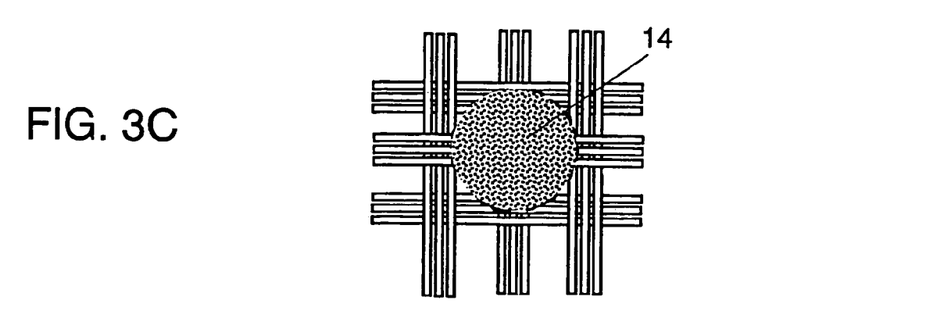
FIG. 3C is a top view of the via after filling conductive paste in the manufacturing method of printed wiring boards in accordance with the third exemplary embodiment of the present invention.

As shown in FIG. 3A, via hole 13 is created using a laser beam on prepreg board material 11 using woven glass fabric 38. When seen from the top, via hole 13 is created by cutting through woven glass fabric 38 as shown in FIG. 3B. Here, fused portion 39 is formed, as shown in FIG. 3B, by applying a predetermined processing method.

After forming fused portion 39, conductive paste 14 is filled into via hole 13 and hot pressed. In this case, the spreading of conductive paste 14 to around via hole 13 is prevented, as shown in FIG. 3C. Accordingly, conductive paste 14 establishes a good electric connection between layers.

If via hole 13 is created by drilling, fused portion 39 can also be created by denaturing and solidifying the resin ingredient in board material 11, typically using the frictional heat generated by drilling to fix woven glass fabric 38 around via hole 13. Accordingly, fused portion 39 does not need to be composed only of reinforcement such as glass fiber. The same effect is achievable if the fluidity of the resin ingredient in board material 11 in the subsequent hot pressing is canceled by curing or denaturing the resin ingredient by processing heat. It is preferable, however, to form fused portion 39 mainly made of woven glass fabric 38 by fusing or denaturing woven glass fabric 38 when forming via hole 13 using a laser beam.

Table 2 shows some of the inventor's experimental results. The double-sided printed wiring board is manufactured by forming via holes 13 under a range of conditions using three types of laser oscillator. As described in the first exemplary embodiment, comparisons of via connection resistance are indicated in Table 2.

It is apparent from these results that via connection resistance is affected by the laser wavelength. The formation of the fused portion is confirmed at an oscillation wavelength of 10.6 µm when the board material with via hole 13 is precisely observed. However, no fused portion is confirmed when the oscillation wavelength is 9.4 µm.

TABLE 2

| Sample No. | Laser oscillator | Oscillation wavelength (ìm) | Hole diameter (ìm) | Via connection resistance (mÙ) |
|---|---|---|---|---|
| 8 | A | 10.6 | 200 | 3 |
| 9 | A | 10.6 | 150 | 5 |
| 10 | B | 9.4 | 200 | 10 |
| 11 | B | 9.4 | 150 | 25 |
| 12 | C | 10.6 | 200 | 2.5 |

When a range of laser beams including an excimer laser, YAG harmonic wave, and carbon dioxide gas laser are used, the fused portion can be formed under selected processing conditions. However, it is preferable to form the fused portion by heating using a carbon dioxide gas laser rather than abulation, which does not use heat, typically using an excimer laser.

Furthermore, as described above, a laser with a wavelength of 10 µm or longer is efficient for forming fused portion 39. The use of a carbon dioxide gas laser is also practically advantageous with respect to processing speed and cost. Viewed from A) Processing efficiency and oscillation efficiency, B) Presence of multiple oscillation wavelengths in the generated laser beam, and C) Fine processing (i.e., light-focusing by an optical system), a processing method mainly using a laser beam with a wavelength of 10 to 11 µm is preferable.

Fourth Exemplary Embodiment

A fourth exemplary embodiment of the present invention is described with reference to FIGS. 4A to 4H.

Figure 4A:
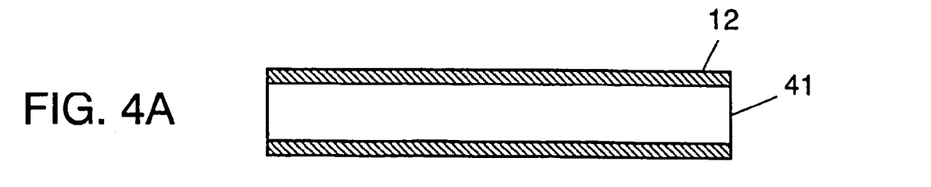
FIGS. 4A to 4H are sectional views illustrating each step of a manufacturing method of printed wiring boards in accordance with a fourth exemplary embodiment of the present invention.

As shown in FIG. 4A, board material 41 is a prepreg 100 µm thick, reinforced by woven glass fabric and sandwiched by film 12 of 20 µm thick made of polyethylene terephthalate (PET) on both faces. Film 12 can be coated with thermosetting resin such as epoxy resin as required. Different from board material 11 used in the first exemplary embodiment, this board material 41 contains a substantial amount of a volatile ingredient after the prepreg manufacturing. Based on the weight change before and after drying at 160° C. for one hour, the amount of the volatile ingredient is 3%.

Figure 4B:
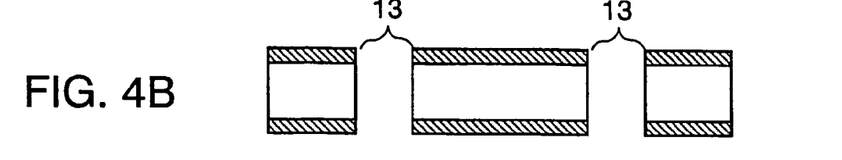
Figure 4C:
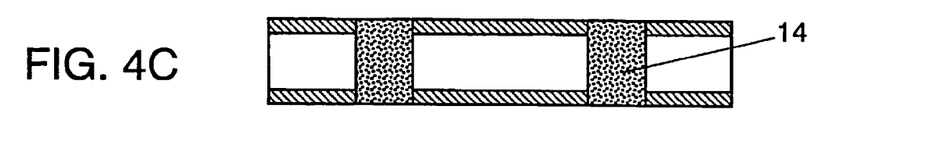
Figure 4D:
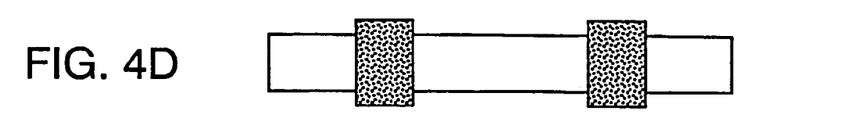

Subsequent steps shown in FIGS. 4B to 4D are the same as those in the first exemplary embodiment.

Figure 4E:
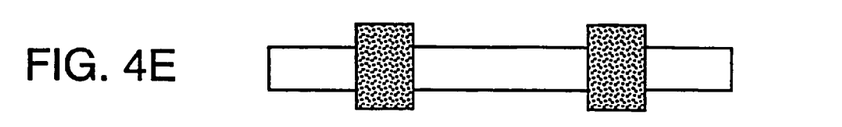

Next, board material 41 is loaded to a vacuum drier (not illustrated), and dried for one hour in a vacuum at about 133 Pa. While drying, a process to introduce warm air at 50° C. and reduce pressure is repeated three times for preventing a temperature drop of board material 41. In this process, the thickness of board material 41 slightly reduces, as shown in FIG. 4E. The reduced thickness is about 2 µm. Accordingly, the height of conductive paste 14 protruding from board material 41 increases about 1 µm respectively on the top and rear faces of the board material and the protruding height becomes about 21 µm, which was originally 20 µm before drying.

Figure 4F:
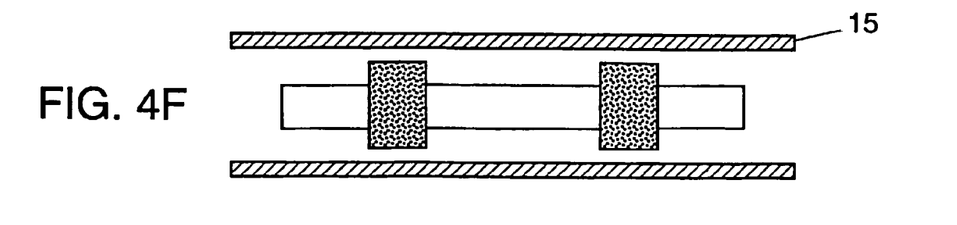
Figure 4G:
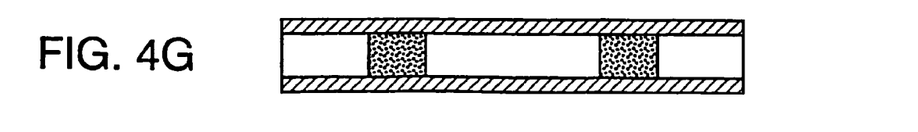
Figure 4H:
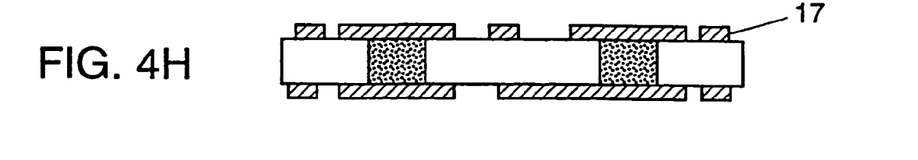

Next, as shown in FIG. 4F, copper foil 15 is disposed on both faces of board material 41, and hot pressing is applied to heat and press board material 41 in the vertical direction in FIG. 4F. Then, a peripheral area is cut off to complete the shape shown in FIG. 4G.

Copper foil 15 is then patterned, typically by etching, to form circuit 17 and complete a double-sided printed wiring board (C-stage) shown in FIG. 1H.

When printed wiring boards are manufactured using the above process, the protruding height of conductive paste 14 can be slightly increased for 2 µm. This achieves better interlayer electrical connection through conductive paste.

Since vacuum pressure is applied in a general hot press process, most of the volatile ingredient in the board material is assumed to be removed during hot pressing. In such a manufacturing method, ingredients in the board material flow relatively greatly during hot pressing. This impedes conductive paste from being compressed in the board thickness direction to establish an electrical connection.

In this exemplary embodiment, the volatile ingredient in board material 41 is removed by vacuum drying before hot pressing to control the fluidity during hot pressing. In addition, the height of conductive paste 14 protruding from board material 41 is increased by removing the volatile ingredient, contributing to an increasingly effective compression rate. Compression of conductive paste 14 in hot pressing thus becomes extremely efficient, establishing a sufficient electrical connection of circuit 17 on the top and rear faces of the printed wiring board.

The above method is also preferably applicable to board material 21 for manufacturing multi-layer printed wiring boards as described in the second exemplary embodiment.

Experimental results of the fourth exemplary embodiment reveal that an amount of volatile ingredient of 0.5% or more in board material 41 shows a significant effect. Since too much volatile ingredient may degrade the shelf life of board material 41, the amount of the volatile ingredient is preferably kept at 5% or less in board material 41.

As for the volatile ingredient, it is preferable to impregnate solvent with a high boiling point such as BCA (butyl carbitol acetate) during the manufacture of board material 41.

The fourth exemplary embodiment refers to vacuum drying for reducing the thickness of board material 41. However, general drying methods using heat can be used under conditions that do not affect the properties of board material 41.

Moreover, protrusion of the interlayer connector from the board material can also be secured by selectively etching the board material using dry or wet etching employing plasma or excimer laser in the step of reducing the thickness of the board material. If this method is applied, a degree of reduction of the board thickness can also be stably controlled.

Fifth Exemplary Embodiment

A fifth exemplary embodiment of the present invention is described with reference to FIGS. 5A to 5C.

Figure 5A:
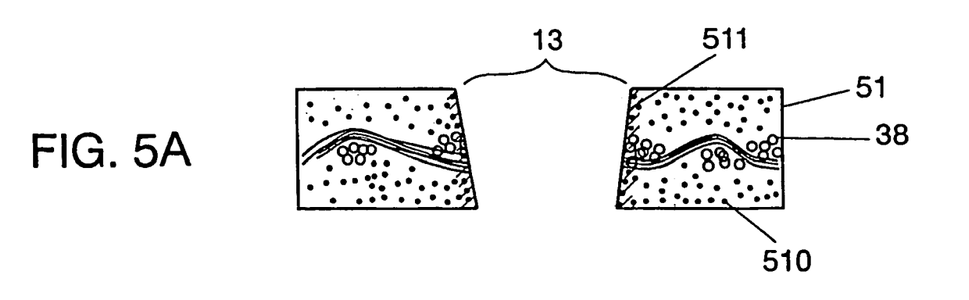
FIG. 5A is a sectional schematic view illustrating a via formation step in a manufacturing method of printed wiring boards in accordance with a fifth exemplary embodiment of the present invention.
Figure 5B:
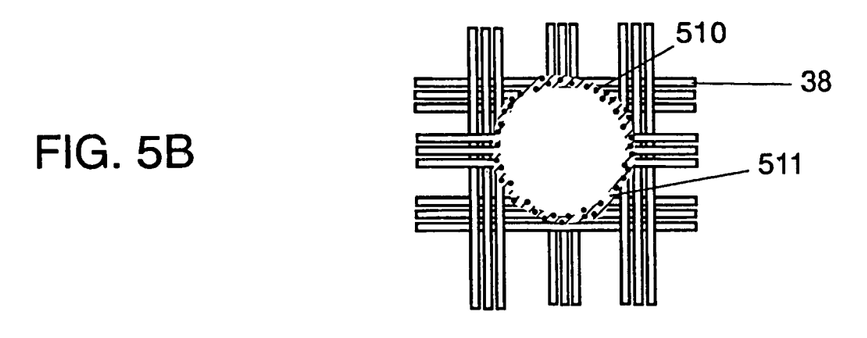
FIG. 5B is a top view of the via before filling conductive paste in the manufacturing method of printed wiring boards in accordance with the fifth exemplary embodiment of the present invention.
Figure 5C:
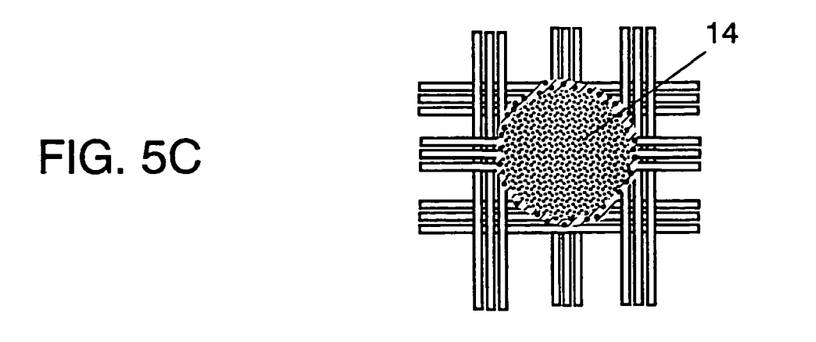
FIG. 5C is a top view of the via after filling conductive paste in a manufacturing method of printed wiring boards in accordance with the fifth exemplary embodiment of the present invention.

As shown in FIG. 5A, via hole 13 is formed by a laser beam on board material 51 which is a prepreg using woven glass fabric. Board material 51 contains filler 510 as solids content.

A general board material is manufactured by impregnating woven glass fabric 38 with liquid called varnish, which is thermosetting resin typically diluted by solvent, and then volatilizing a volatile ingredient such as solvent and adjusting a curing degree of thermosetting resin in the drying process. Board material 51 used in the fifth exemplary embodiment is manufactured by dispersing filler in this varnish. In this exemplary embodiment, silica filler containing silica ($SiO_2$) with about 1 to 2 μm diameter is used.

As shown in FIG. 5A, a low fluidity layer 511 is formed around via hole 13. Low fluidity layer 511 is formed mainly through the next phenomenon, including denature of thermosetting resin around via hole 13 by heat. This heat is generated by converting processing energy that filler 510 absorbs during laser processing. In addition, a layer of denatured thermosetting resin is formed using filler 510, which is solids content, as a core. This layer is formed very efficiently when filler 510 exists, compared to the case without filler 510. Low fluidity layer 511 naturally has the possibility of containing woven glass fabric 38.

After low fluidity layer 511 is formed, conductive paste 14 is filled in via hole 13. When hot pressing is applied, spreading of conductive paste 14 around via hole 13 is prevented, as shown in FIG. 5C. Accordingly, a good interlayer electrical connection is achieved by conductive paste 14.

Low fluidity layer 511 can also be formed by denaturing the resin ingredient in board material 51 by friction heat generated while drilling via hole 13, and solidifying this denatured resin with filler 510. However, it is preferable to make filler 510 absorb energy while forming via hole 13 by a laser beam, and convert it to heat for forming low fluidity layer 511.

With respect to the laser wavelength in the above process, low fluidity layer 511 is formed efficiently when an oscillation wavelength of 9 μm or longer is used for the $CO_2$ gas laser. In addition, materials other than silica can be used for filler 510. The same effect is achievable with talc, gypsum powder, metal hydroxides (e.g. aluminum hydroxide), etc.

In all of the above exemplary embodiments, the board material refers to B-stage material in which thermosetting resin is impregnated in woven glass fabric. However, it is apparent that nonwoven fabric may be used instead of woven glass fabric. Furthermore, organic fiber such as alamid fiber may be used instead of glass fiber.

In the first, second and fourth exemplary embodiments, a B-stage film can also be used instead of a prepreg for the board material.

In addition, a mixed material of woven and nonwoven fabric, such as nonwoven glass fabric sandwiched by two sheets of glass fiber, may be used as reinforcement.

In all of the above exemplary embodiments, thermosetting resin refers to epoxy resin. However, one of the following substances, thermosetting resin compositions made of a mixture of two or more of the following substances, or these thermosetting resin compositions denatured by thermoplastic resin can be used: epoxy melamine resin, unsaturated polyester resin, phenol resin, polyimide resin, cyanate resin, cyanic acid ester resin, naphthalene resin, urea resin, amino resin, alkyd resin, silicic resin, furan resin, polyurethane resin, amino alkyd resin, acrylic resin, fluorocarbon resin, polyphenylene ether resin, and cyanate ester resin. Flame retardant or inorganic filler can also be added as required.

Moreover, a circuit typically made of metal foil which is tentatively secured on a support can be used instead of the copper foil.

In the exemplary embodiments, the interlayer connector refers to conductive paste made by mixing conductive particles such as copper powder, curing agent, and thermosetting resin. Instead, diverse compositions such as those mixed with polymer material and conductive particles in an appropriate viscosity, which allows them to be discharged to the board material during hot pressing, or those with solvent can also be used. Furthermore, a conductive protruding post formed typically by plating, other than conductive paste, or an independent conductive particle, not in the form of paste, having a relatively large particle size can also be used as the interlayer connector.

INDUSTRIAL APPLICABILITY

The manufacturing method of printed wiring boards of the present invention has one of the following steps of:
A) restricting the resin flow during hot pressing;
B) joining fiber reinforcements together by fusion or adhesion;
C) thinning a board material after the filling process; and
d) forming a low fluidity layer with a filler mixed in the board material.

The material for manufacturing printed wiring boards of the present invention is given a property to allow the resin flow to be controlled during hot pressing, or contains a volatile ingredient to allow the thickness of the board material to be efficiently reduced after the filling process. Accordingly, the present invention efficiently establishes electrical connection by the interlayer connector such as conductive paste.

In particular, the use of a woven fabric as reinforcement for the board material demonstrates an exceptional effect for stabilizing interlayer connection while keeping the advantage of dimensional stability of the woven fabric. This is achieved by controlling the fluidity or applying a treatment to partially prevent the movement of fiber in an area of interlayer connection at the same time as when holes are created, or by reducing the thickness of the board material.

Consequently, the reliability of interlayer electrical connection by the interlayer connector such as conductive paste improves, providing high-quality, high-density printed wiring boards.

The invention claimed is:

1. A method of manufacturing a printed wiring board, comprising:
    laminating board materials to form a laminated body, the board materials including a first B-stage board material comprised of a thermosetting resin and reinforcing woven glass fabric, and comprised of an interlayer connection formed of a via hole filled with conductive paste arranged through said thermosetting resin and woven glass fabric, the board materials further including at least one of:
        one of a metal foil, a metal foil bonded on a support, and a circuit pattern bonded on a support;
        a second B-stage board material including a thermosetting resin and reinforcing woven glass fabric, and including an interlayer connection comprised of a via hole filled with conductive paste;
        a third B-stage board material including a thermosetting resin and reinforcing woven glass fabric, including an interlayer connection comprised of a via hole filled with conductive paste, and including one of a circuit pattern and metal foil; and
        a C-stage board material having one of a circuit pattern and a metal foil;
    hot-pressing the laminated body by heating and pressing using a predetermined temperature profile based on one of a rate of temperature rise and a combination of heating temperature and curing time, such that a flow rate of the thermosetting resin due to said hot-pressing is no less than 1% and no greater than 20%, the flow rate being defined as a ratio of a mass of a leaked portion of thermosetting resin to a mass of the first B-stage board material, the second B-stage board material, and the third B-stage board material; and removing a peripheral portion of the hot-pressed laminated body, the peripheral portion including the leaked portion of the thermosetting resin leaked during said hot-pressing.

2. The method of claim 1, wherein the predetermined temperature profile is based on a rate of temperature rise no greater than 3° C. per minute.

3. A method of manufacturing a printed wiring board, comprising:

forming an interlayer connection in a B-stage board material containing a volatile ingredient, said forming including:

sandwiching the B-stage board material between films, each of the films being placed at a face of the B-stage board material;

creating a via hole in the B-stage board material;

filling conductive paste into the via hole; and peeling off the films;

laminating board materials including at least the B-stage board material; and reducing a thickness of the B-stage board material by removing the volatile ingredient from the B-stage board material by vacuum drying the B-stage board material so as to increase protrusion of the interlayer connection from the B-stage board material, said reducing being conducted after said peeling off of the films; and hot pressing the laminated board materials after said reducing the thickness of the B-stage board material.

4. The method of claim 3, wherein said forming of the interlayer connection comprises forming the interlayer connection in a B-stage board material containing an amount of the volatile ingredient in a range of 0.5% to 5.0%.

5. A method of manufacturing a printed wiring board, comprising:

laminating board materials including a B-stage board material;

creating a via hole in the B-stage board material for an interlayer connection;

forming an interlayer connection in the via hole of the B-stage board material;

reducing a thickness of the B-stage board material by etching the B-stage board material so as to increase protrusion of the interlayer connection from the B-stage board material; and hot pressing the laminated board materials after said reducing the thickness of the B-stage board material.

6. The method of claim 5, wherein said forming an interlayer connection in the B-stage board material comprises filling the via hole in the B-stage board material with conductive paste prior to said reducing of the thickness of the B-stage board material.

7. The method of claim 5, wherein said reducing of the thickness of the B-stage board material comprises etching the B-stage board material before said laminating of the board materials.

* * * * *

UNITED STATES PATENT AND TRADEMARK OFFICE
CERTIFICATE OF CORRECTION

PATENT NO. : 7,059,044 B2  Page 1 of 1
APPLICATION NO. : 10/380661
DATED : June 13, 2006
INVENTOR(S) : Toshihiro Nishii It is certified that error appears in the above-identified patent and that said Letters Patent is hereby corrected as shown below:

IN THE CLAIMS

In Claim 2, column 11, line 11, please replace "3°C. per minute." with --3°C per minute.--.

Signed and Sealed this

Ninth Day of January, 2007

JON W. DUDAS
*Director of the United States Patent and Trademark Office*